(12) United States Patent
Cheng et al.

(10) Patent No.: US 8,914,700 B2
(45) Date of Patent: Dec. 16, 2014

(54) DATA PROCESSING METHOD, APPARATUS AND SYSTEM

(71) Applicant: Huawei Technologies Co., Ltd., Shenzhen (CN)

(72) Inventors: Yongbo Cheng, Shenzhen (CN); Chenghong He, Shenzhen (CN); Kejia Lan, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/025,553

(22) Filed: Sep. 12, 2013

(65) Prior Publication Data

US 2014/0013182 A1 Jan. 9, 2014

Related U.S. Application Data

(63) Continuation of application No. PCT/CN2011/074797, filed on May 27, 2011.

(51) Int. Cl.
*H03M 13/00* (2006.01)
*H03M 13/29* (2006.01)
*G06F 11/10* (2006.01)

(52) U.S. Cl.
CPC ....... *H03M 13/2906* (2013.01); *G06F 11/1048* (2013.01)
USPC ...................................................... 714/758

(58) Field of Classification Search
CPC ..... H03M 13/29; H03M 13/09; H03M 13/13; H03M 13/2906; G06F 11/10; G06F 13/28; G06F 21/64; G06F 3/061; G06F 3/0656; G06F 3/0659; G06F 3/0679; G06F 11/1004; G06F 11/1048; G11C 2029/0411

USPC .......... 714/758, E11.023, E11.145, 718, 755, 714/763; 711/E12.001, 102, 103, 170; 702/189

See application file for complete search history.

(56) References Cited

U.S. PATENT DOCUMENTS 7,203,890 B1 4/2007 Normoyle
7,836,379 B1 11/2010 Ricci et al.
(Continued)

FOREIGN PATENT DOCUMENTS

CN 101097784 A 1/2008
CN 101908376 A 12/2010

OTHER PUBLICATIONS

Office Action issued in corresponding Chinese Patent Application No. 201180000623.3, mailed Aug. 22, 2012, 10 pages.

(Continued)

*Primary Examiner* — Guy Lamarre
(74) *Attorney, Agent, or Firm* — Brinks Gilson & Lione

(57) ABSTRACT

A method according to an embodiment of the present disclosure comprising: receiving a read instruction transmitted by a host device, the read instruction including a first address; reading first data together with a first CRC code and a first ECC which are associated with the first data from a memory based on the first address; and performing error detection on the first data based on the first CRC code, and performing error correction on the first data based on the first ECC if an error is detected. With the embodiments of the disclosure, the CRC code with better capability of error detection is adopted to perform error detection on the data. If any error is detected, error correction is performed using the ECC. Thus, it is possible to overcome the problem as to insufficient capability of error detection of the ECC in the prior art, thereby improving the system performance.

20 Claims, 8 Drawing Sheets

(56) References Cited

U.S. PATENT DOCUMENTS

2008/0005646 A1    1/2008  Bains
2009/0049266 A1*  2/2009  Kuhne ......................... 711/170
2010/0211834 A1*  8/2010  Asnaashari et al. .......... 714/718
2010/0313102 A1  12/2010  Chen et al.

OTHER PUBLICATIONS

International Search Report issued in corresponding PCT Patent Application No. PCT/CN2011/074797, mailed Feb. 23, 2012, 3 pages.

* cited by examiner

DATA PROCESSING METHOD, APPARATUS AND SYSTEM

CROSS-REFERENCE TO RELATED APPLICATIONS

This application is a continuation of International Application No. PCT/CN2011/074797, filed on May 27, 2011, which is hereby incorporated by reference in its entirety.

FIELD

The present disclosure relates to computer technology, especially to a data processing method, apparatus and system.

BACKGROUND

Data reliability is extremely important to the performance of a system in the field of error tolerant computer. Data is stored in a Dynamic Random Access Memory ("DRAM") in the runtime of the system. Due to liability to error during data storage in the DRAM, error detection and correction on the memory is a very important type of reliability technology in the field of error tolerant computer.

Nowadays, a cache in an Intel processor has a row size of 64 Byte or 128 Byte. For a Dual In-line Memory Module ("DIMM") with Error Correction Code ("ECC"), correction to content failure in a DRAM granularity is realized by means of 32-byte data plus a 32-bit ECC in the current error correction scheme. In a DIMM consisting of x4 DRAM granularities, data arrangement of 32-byte data plus a 32-bit ECC check word in the DIMM is illustrated in FIG. 1, in which the dotted lines represent the omitted DRAM granularities, also referred to as Device, and the data therein. As illustrated in FIG. 1, data is stored in the DRAM granularities Device0-15, and ECC is stored in the DRAM granularities Device16-17. If a DRAM granularity, Device4, fails, error happens over 16 bits in an ECC word. Upon detection of the error, the ECC is operable to correct the error over the 16 bits and the corrected data is written back to the memory.

In the above-stated prior art, an ECC word is simply capable of detecting an error associated with two failed DRAM granularities, that is, a 32-bit error corresponding to two failed DRAM granularities. There is a problem as to insufficient capability of error detection.

SUMMARY OF THE APPLICATION

The embodiments of the application provide a data processing method, apparatus and system to solve the problem as to insufficient capability of error detection using the ECC in the prior art.

In an aspect, an embodiment of the disclosure provide a data processing method, comprising: receiving a read instruction transmitted by a host device, the read instruction including a first address; reading first data together with a first Cyclic Redundancy Checks, CRC, code and a first Error Correction Code, ECC, which are associated with the first data from a memory based on the first address; and performing error detection on the first data based on the first CRC code, and performing error correction on the first data based on the first ECC if an error is detected.

In another aspect, an embodiment of the disclosure provide a data processing method, comprising: receiving a write instruction transmitted by a host device, the write instruction including fifth data and a fifth address; performing Cyclic Redundancy Checks, CRC, encoding and Error Correction Code, ECC, encoding on the fifth data to generate a fifth CRC code and a fifth ECC; and writing the fifth CRC code, the fifth ECC and the fifth data to a location of a memory corresponding to the fifth address.

In another aspect, an embodiment of the disclosure provide a data processing apparatus, comprising: a receiving module configured to receive a read instruction transmitted by a host device, the read instruction including a first address; a reading module configured to read first data as well as a first CRC code and a first ECC which are associated with the first data from a memory according to the first address; and an error detection and correction module configured to perform error detection on the first data based on the first CRC code and perform error correction on the first data based on the first ECC if an error is detected.

In another aspect, an embodiment of the disclosure provide a data processing apparatus, comprising: a receiving module configured to receive a write instruction transmitted by a host device, the read instruction including fifth data and a fifth address; an encoding module configured to perform Cyclic Redundancy Checks, CRC, encoding and Error Correction Code, ECC, encoding on the fifth data to generate a fifth CRC code and a fifth ECC; and a writing module configured to write the fifth CRC code, the fifth ECC and the fifth data to a location of a memory corresponding to the fifth address.

In yet another aspect, an embodiment of the disclosure provide a data processing system, comprising a host device, a controller and a memory, which are connected in sequence, wherein the host device is configured to transmit a read instruction to the controller, the controller comprises the data processing apparatus as defined above, and the memory is configured to store first data, first Cyclic Redundancy Checks, CRC, code and first Error Correction Code, ECC, which are associated with the first data.

With the embodiments of the disclosure, the CRC code with better capability of error detection is adopted to perform error detection on the data read from the memory. If any error is detected, error correction is performed on the read data using the ECC. Thus, it is possible to overcome the problem as to insufficient capability of error detection using the ECC in the prior art, thereby improving the system performance.

BRIEF DESCRIPTION OF THE DRAWINGS

Brief description of the drawings is given to describe the embodiments of the application more clearly. Obviously, those drawings are simply presented to illustrate some embodiments of the application. It is possible for those skilled in the art to derive the other drawings from them without any inventive work.

DETAILED DESCRIPTION OF THE EMBODIMENTS

The embodiments of the application will be clearly and sufficiently described with reference to the accompanying drawings to facilitate understanding of the objective, solution and advantages thereof. Apparently, the embodiments of the application to be described here are simply some of the embodiments of the application, but not all. Any other embodiments at which a skilled person in the state of art can arrive with the teaching of the described embodiments of the application without inventive work should be regarded as falling within the scope of protection to be claimed by the application.

Figure 2:
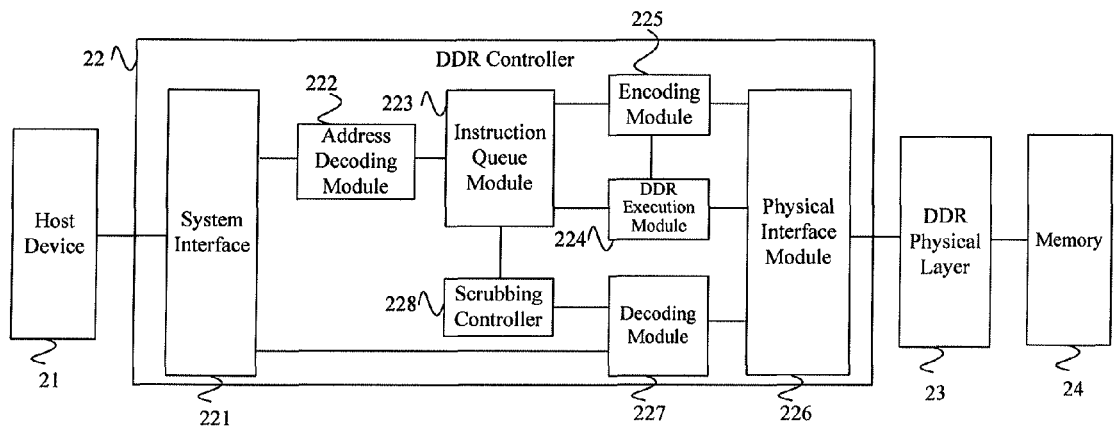
FIG. 2 is a diagram showing an application of an embodiment of the disclosure.

First, an architecture to which the embodiments of the disclosure are applied will be described for better understanding of the embodiments of the disclosure. FIG. 2 is a diagram showing an application of an embodiment of the disclosure. As illustrated in FIG. 2, a Dual Data Rate (simply referred to as "DDR") controller 22 is connected to a host device 21 via a system interface 221, which can be a device launching instructions to the DDR controller 22, such as, a CPU. DDR controller 22 receives read/write instructions from the host device 21 and delivers read data read from a memory 24 to the host device 21. The memory 24 may be a memory like DIMM. Typically, a write instruction includes write data. There are partial write instructions other than the read/write instructions. The DDR controller 22 processes the partial write instructions as a read instruction plus a write instruction. Here, only are read/write instructions taken as an example to facilitate description of the embodiments of the disclosure. The disclosure is not restricted in this regard. It is easy for a skilled person in the art to envisage a process using the partial write instructions with the teaching of the embodiments of the disclosure. An address decoding module 222 is operable to decode the system address in the read/write instruction into a physical address of the memory 24, including Bank, Row, and Column addresses to enable addressing in the memory 24. Typically, a memory is divided into a plurality of Banks. An instruction queue module 223 is operable to schedule an instruction queue according to the type, priority or the like of the instructions. A DDR execution module 224 is operable to process the instructions in the instruction queue according to the DDR protocol, generate resultant controlling instructions in compliance with the DDR timing to transmit to a DDR physical layer ("DDR PHY") 23 via a physical interface module 226, and control the timing and sequence at/in which encoded data generated by an encoding module 225 enters the physical interface module 226. The DDR PHY 23 is connected with the memory 24. The encoding module 225 and a decoding module 227 are operable to perform encoding of the write data for error detection and correction and perform error detection and correction on the read data, respectively. When a correctable error is found while checking the read data, a scrubbing controller 228 transmits a write instruction to the instruction queue module 223 to write the proper data corrected by the decoding module 227 back to the memory 24, thereby preventing the errors from becoming uncorrectable with the lapse of time.

Figure 3:
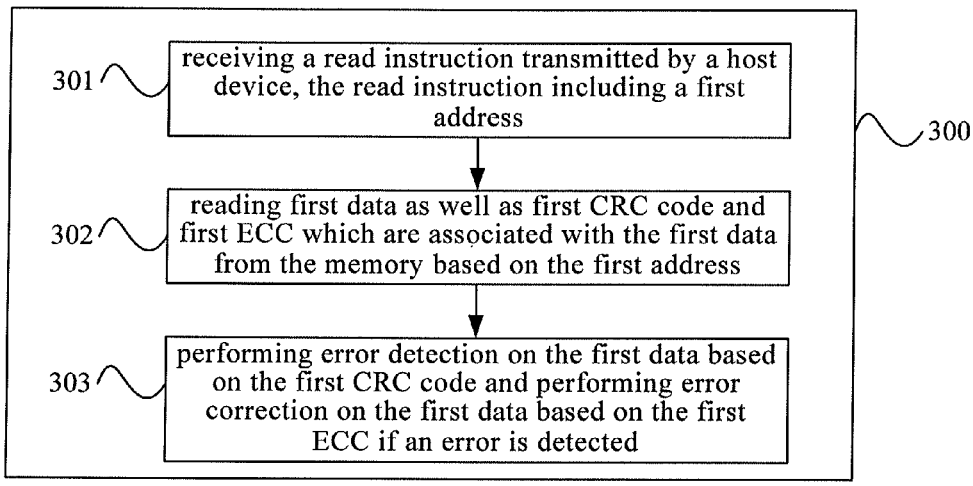
FIG. 3 is a flowchart showing the first example of a data processing method according to an embodiment of the disclosure.

FIG. 3 is a flowchart showing the first example of a data processing method according to an embodiment of the disclosure. As illustrated in FIG. 3, an exemplary method 300 comprises the steps as follows.

Step 301: receiving a read instruction transmitted by the host device, the read instruction including a first address.

For example, the DDR controller receives the read instruction transmitted by the CPU. The first address is a read instruction address and also referred to as a system address.

Step 302: reading first data as well as first Cyclic Redundancy Checks, CRC, code and first ECC which are associated with the first data from the memory based on the first address.

Here, it is possible to transform the system address in the read instruction to a physical address of the memory by using prior art technique and then read the first data from a location of the memory corresponding to the physical address. No restriction is imposed in this regard. For the sake of easy description, the term, system address, is used here to collectively represent either of the system address in the read/write instruction transmitted by the host device and the physical address of the memory transformed from the system address.

Step 303: performing error detection on the first data based on the first CRC code and performing error correction on the first data based on the first ECC if an error is detected.

Here, the error detection and correction can be implemented with the prior art methods. If no error is detected, the method proceeds as the prior art methods, for example, returning the first data to the host device. When the error correction has been performed, the corrected data is written back to the memory as done in the prior art process. Redundant description is omitted here.

Figure 1:
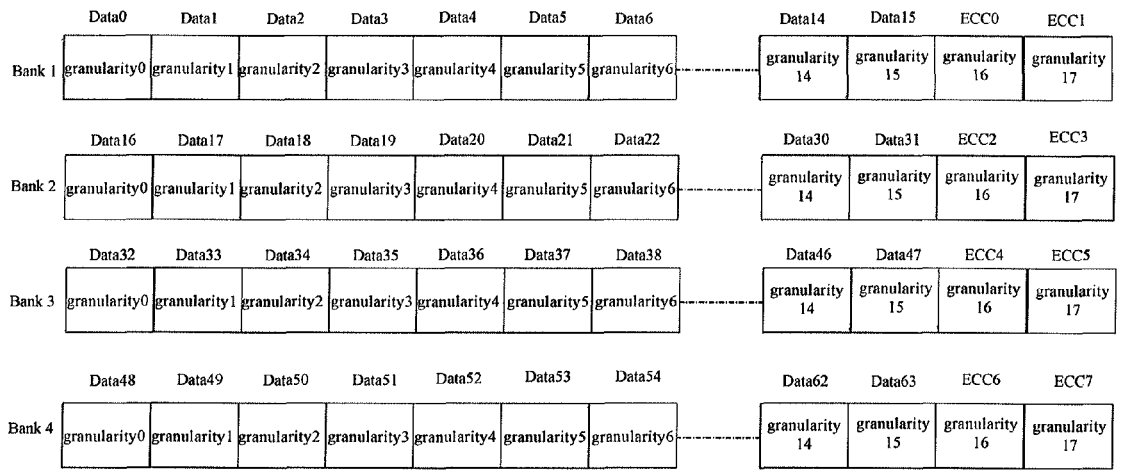
FIG. 1 is a diagram showing a DIMM data arrangement in the prior art.
Figure 4:
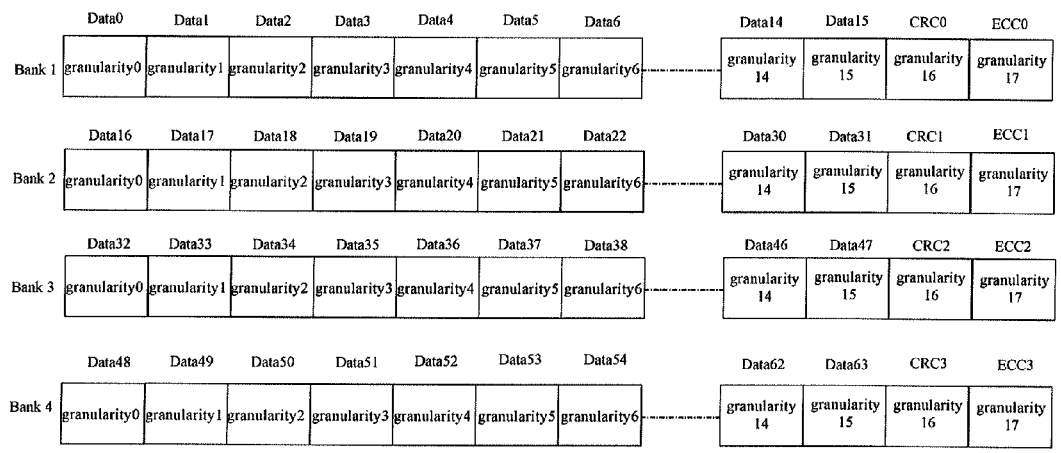
FIG. 4 is a diagram showing a DIMM data arrangement according to the embodiment as illustrated in FIG. 3.

In particular, the embodiment of the disclosure optimizes the 32-byte data plus 32-bit ECC as shown in FIG. 1 so that a DIMM data arrangement including 32-byte data plus 16-bit CRC code and 16-bit ECC is obtained as shown in FIG. 4. The number of bits of the CRC code and the ECC as well as the locations of the CRC code and the ECC in the data arrangement (that is, the memory granularities to be occupied) may vary depending on the data arrangement of the actual memory. The embodiment of the disclosure imposes no restriction in this regard.

Turning back to FIG. 2, the decoding module 227 in the prior art performs ECC error detection and ECC error correction on the read data while the decoding module 227 according to the embodiment of the disclosure performs error detection using the CRC code and performs error correction using the ECC if any error is detected. The CRC code has a higher speed of computation and better capability of error detection. The CRC algorithms in the prior art can be adopted. If the CRC-16 algorithm is adopted, a codeword has a length of $n=288$ bits and an information field has a length of $k=256$ bits. It has a capability of error detection as follows:

1) a burst error with a burst length $<=n-k$;
2) most of errors with a burst length $=n-k+1$, undetectable errors of this type occupying merely $2-(n-k-1)$;
3) most of errors with a burst length $>n-k+1$, undetectable errors of this type occupying merely $2-(n-k)$;

4) all of odd numbers of random errors.

In the embodiment of the disclosure, the CRC code with greater capability of error detection is adopted to perform error detection for the data read from the memory and the Error Correction Code, ECC, is adopted to perform error correction on the read data if an error is detected. Thus, it is possible to overcome the problem of insufficient capability of error detection using the ECC in the prior art, thereby improving the system performance.

Figure 5:
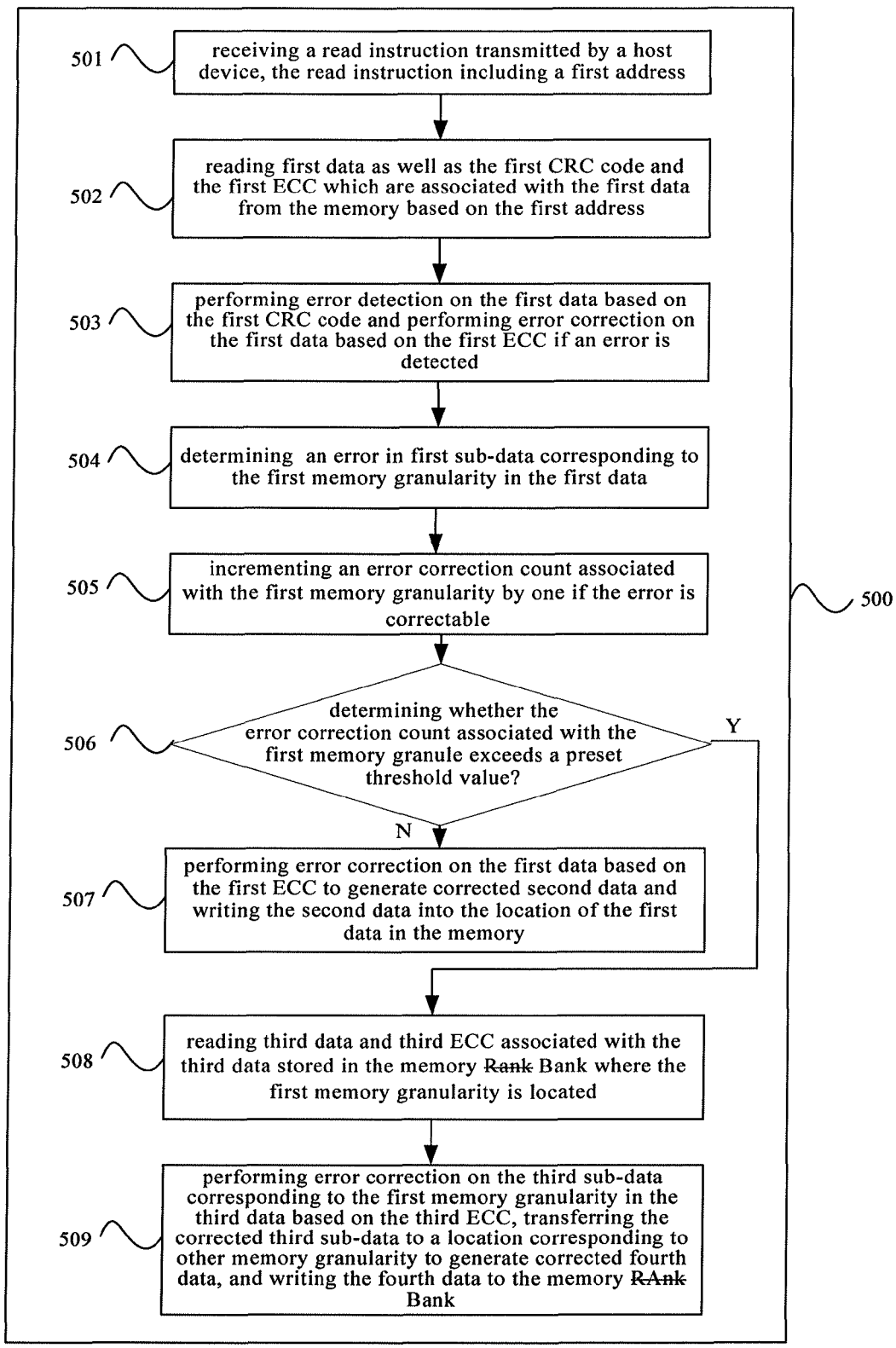
FIG. 5 is a flowchart showing the second example of the data processing method according to the embodiment of the disclosure.

FIG. 5 is a flowchart showing the second example of the data processing method according to the embodiment of the disclosure. As illustrated in FIG. 5, an exemplary method 500 comprises the steps as follows.

Step 501: receiving a read instruction transmitted by the host device, the read instruction including a first address.

Step 502: reading first data as well as the first CRC code and the first ECC which are associated with the first data from the memory based on the first address.

For example, turning to FIG. 4, it is assumed that the read instruction specifies reading of four banks of data as shown in FIG. 4, where the first data is stored in the memory granularities Device0-15, the first CRC code associated with the first data is stored in Device16, and the first ECC associated with the first data is stored in Device17.

Step 503: performing error detection on the first data based on the first CRC code and performing error correction on the first data based on the first ECC if an error is detected.

Step 504: determining an error in first sub-data corresponding to the first memory granularity in the first data.

In particular, a memory granularity associated with erroneous data is identified from the position of the erroneous data during error correction. In practice, it is possible that the sub-data corresponding to a plurality of memory granularities has errors. This can be handled in a similar way as a scenario where the sub-data corresponding to one memory granularity has error(s), which will be discussed below. The embodiment of the disclosure imposes no restriction in this regard. Here, it is assumed that the first memory granularity is Device4, and the sub-data corresponding to Device4 has error(s).

Step 505: incrementing an error correction count associated with the first memory granularity by one if the error is correctable.

If the error is uncorrectable, the method proceeds as a prior art process, for example, informing a higher-layer operating system of the error. The embodiment of the disclosure imposes no restriction in this regard.

Step 506: determining whether the error correction count associated with the first memory granularity exceeds a preset threshold value, and executing the step 508 if the determination is positive and the step 507 if the determination is negative.

Here, the threshold value can be set in view of an experience value. Provided the threshold value is set to three (3), it suggests that a memory granularity fails and needs to be isolated if correctable errors appear for more than three times in the memory granularity.

Step 507: performing error correction on the first data based on the first ECC to generate corrected second data and writing the second data into the location of the first data in the memory.

Provided only erroneous is the first sub-data in the first data, the error correction is performed on the first sub-data based on the first ECC, leaving the data other than the first sub-data in the first data as it was, to obtain the corrected second data. Here, the second data can be written into the location of the first data in the memory by means of the writing operation in the prior art. It equivalently removes the erroneous first data from the memory and stores the corrected second data at the same location. The step ends.

Step 508: reading third data and third ECC associated with the third data stored in the memory Bank where the first memory granularity is located.

For an x4 DRAM, a Bank is a set of 18 memory granularities that can gather 72-bit data. Typically, a memory comprises at least one Bank. If the first memory granularity is located at Bank1 of the memory, all the data in Bank1 is read out. That is, the third data refers to all the data stored in the Bank1. For example, the third data includes all the data in Device0-Device15, including but not limited to the four banks of data as shown in FIG. 4. The third ECC associated with the third data refers to all the ECC stored in Device17. Typically, the third CRC code associated with the third data, for example, all the CRC code stored in Device16, is also read while reading the third data and the third ECC. For example, a beginning address and an end address of the memory Bank where the first memory granularity is located are identified and data starts to be read from the beginning address.

Step 509: performing error correction on the third sub-data corresponding to the first memory granularity in the third data based on the third ECC, transferring the corrected third sub-data to a location corresponding to another memory granularity to generate corrected fourth data, and writing the fourth data to the memory Bank.

Figure 6:
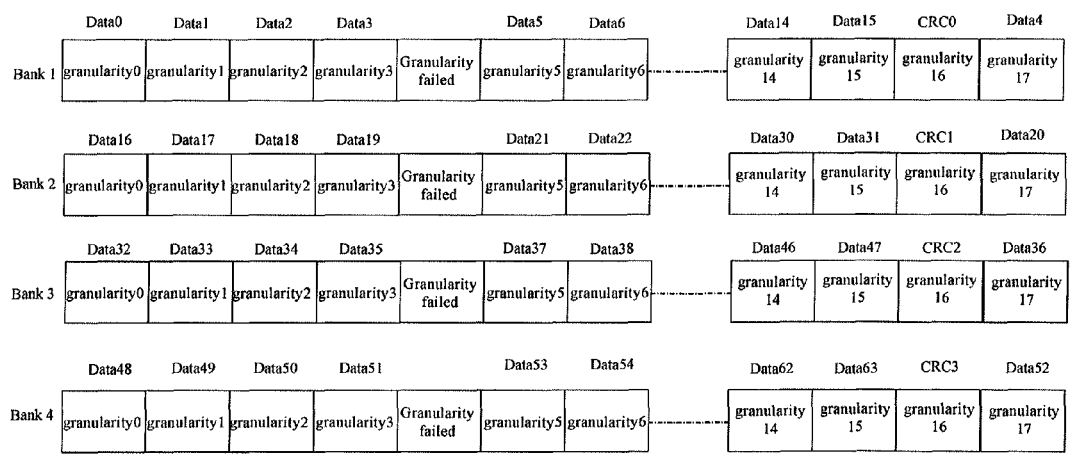
FIG. 6 is a diagram showing a DIMM data arrangement according to the embodiment as illustrated in FIG. 5.

Here, the another memory granularity may be one where no data is stored. If there is not any memory granularity with no data stored in the memory Bank, the corrected third sub-data can be transferred to a memory granularity corresponding to the third ECC like Device17 as shown in FIG. 4. A data arrangement after transferring is illustrated in FIG. 6. It is also noted that it is not necessary to perform CRC and ECC encoding on the fourth data if the corrected third sub-data is transferred to the memory granularity associated with the third ECC. Instead, the fourth data and the CRC associated with the third data may be written into the memory Bank. If the corrected third sub-data is transferred to another memory granularity, it is necessary to perform CRC and ECC encoding on the fourth data to generate the fourth CEC and the fourth ECC. Then, the fourth data, the fourth CRC and the fourth ECC are written into the memory Bank.

Steps 508-509 are intended to isolate the failed first memory granularity. The first memory granularity is no longer used to store any data after it is isolated.

In the prior art, error correction is performed for a plurality of periods once an error is detected and the corrected data is written back to the memory by starting a write-back operation. If a memory granularity in the memory fails, ECC error correction and write-back operation will be triggered upon any reading. For an instance of DDR3 memory, reading and writing operations have substantially the same timing in the DDR3 memory, though reading operation happens far more frequently than writing operation in a typical application. As such, it takes at least half of the system's capability to perform write-back operation, thereby significantly impairing the performance of the system. Furthermore, in the event of physical failure of DRAM granularities, correction and write-back operation will occur upon every reading. Even worse, it is impossible to write the proper data back to the memory when the write-back operation is performed, thereby significantly impairing the performance of the system. In the embodiment of the disclosure, the times for which a memory granularity makes an error are counted to determine whether the memory granularity fails so as to determine whether to perform correction and write-back operation. Further, a method is applied to mark the failed memory granularity such that the data in the failed memory granularity is transferred to another memory granularity(ties) upon start-up of isolation. If the data in the failed first memory granularity was transferred to the memory granularity in which the ECC is stored, the system would lose its capability of error correction, but remain the capability of error detection enabled by the CRC code. Since the failed memory granularity Device4 has been isolated from the subsequent data processing, no error will appear in the subsequent reading and it is not necessary to execute the error correction and the scrubbing and write-back operations any more. Thus, it is possible to prevent unnecessary operations of the failed memory granularity, causing no loss of performance of the system as compared to the normal reading without any errors. As a result, the performance of the system is remarkably improved in comparison with the prior art scenario with the failed memory granularity(ties) existing.

During the isolation in steps 508-509, it is possible that the host device launches a read/write instruction to the memory BANK where the first memory granularity is located. Since some of the memory BANK has been changed in the DIMM to the new data arrangement as shown in FIG. 6 while the part of data yet to be isolated remains the old data arrangement as shown in FIG. 4, the access to the area addressed to the memory BANK at this time may cause collision, or errors in the data committed to the system. To avoid the address collision, it is necessary to record the data address on which reading has been performed as the second address, also referred to as isolation read address, and the data address on which the write-back operation is performed as the third address, also referred to as isolation write address. By comparing the isolation read address and the isolation write address to the fourth address, also referred to as system address, in the read/write instruction, it is possible to settle the collision so as to perform the read/write operations with different data arrangements.

Figure 7:
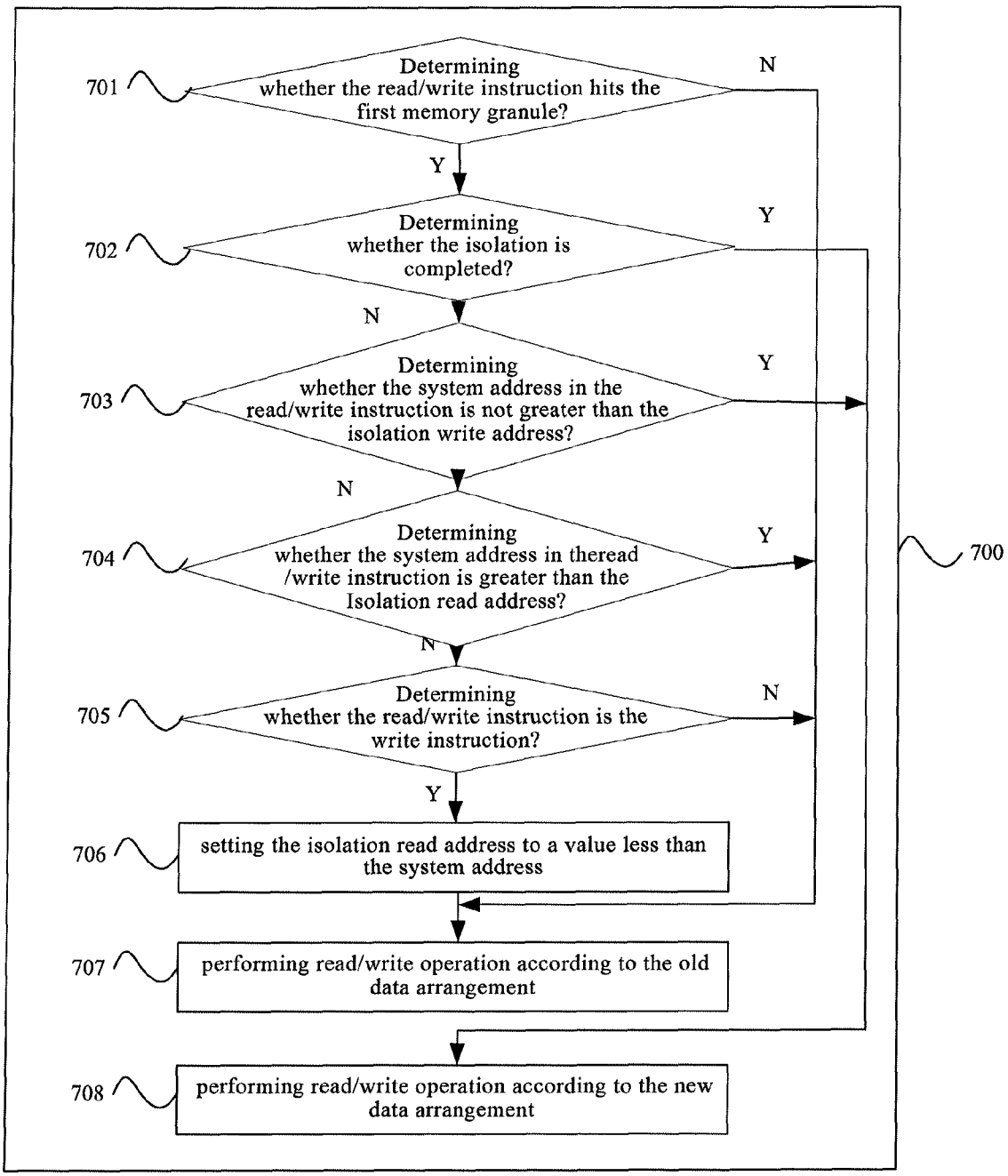
FIG. 7 is a flowchart showing a collision settlement process according to the embodiment as illustrated in FIG. 5.

A collision settlement process 700 is illustrated in FIG. 7, comprising the steps as follows.

Step 701: determining whether the read/write instruction hits the first memory granularity, and jumping to step 702 if the determination is positive and otherwise to step 707.

In particular, it is determined whether the system address in the read/write instruction falls within a range between the beginning and end addresses of the memory Bank. If yes, the determination shows hit. Otherwise, it shows missed.

Step 702: determining whether the isolation is completed, and jumping to step 708 if the determination is positive and otherwise to step 703.

In particular, an isolation flag bit is set for flagging end of the isolation when the isolation is initialized. Here, the isolation flag bit is used to determine whether the isolation ends.

Step 703: determining whether the system address in the read/write instruction is not greater than the isolation write address, and jumping to step 708 if the determination is positive and otherwise to step 704.

Step 704: determining whether the system address in the read/write instruction is greater than the isolation read address, and jumping to step 707 if the determination is positive and otherwise to step 705.

Step 705: determining whether the read/write instruction is the write instruction, and jumping to step 706 if the determination is positive and otherwise to step 707.

Step 706: setting the isolation read address to a value less than the system address.

Thus, the data written this time will be read in the subsequent isolation, then corrected and written back to the new data arrangement. In particular, the isolation read address can be set to the system address minus one in order to reduce the amount of data to be written back in the subsequent isolation.

Here, detailed description will be given with regard to the isolation read/write operations in the isolation. Although all the data in the entire BANK needs to be read out in the isolation, it is necessary to divide this task into a plurality of isolation read operations. Every time the isolation read operation has been performed, the greatest address from which data has been read is recorded as an isolation read address. Every time the isolation read operation is initialized, the isolation reading will be performed from the address indicated by the isolation read address plus one. The isolation write operation proceeds similarly. Every time the isolation write operation has been performed, the greatest address to which data has been written is recorded as an isolation write address. Every time the isolation write operation is initialized, the isolation writing will be performed from the address indicated by the isolation write address plus one.

Step 707: performing the read/write operation according to the old data arrangement.

Here, the old data arrangement is the data arrangement before the isolation. If the Bank has never been subject to any isolation, the data arrangement before the isolation is the initial data arrangement of the Bank.

Step 708: performing the read/write operation according to the new data arrangement.

Here, the new data arrangement is the current data arrangement after the isolation.

In the embodiment of the disclosure, the CRC code with better capability of error detection is adopted to perform error detection on the data read from the memory. If any error is detected, error correction is performed on the read data using the Error Correction Code, ECC. The memory granularity corresponding to the erroneous data is identified during the error correction. The times for which the individual memory granularities encounter errors are counted. The memory granularity will be determined as failed and isolated if the counted times exceed a preset threshold value. Consequently, the disclosure can overcome the problem as to insufficient capability of error detection of ECC, thereby improving the system performance and preventing the impact on the system performance due to failed memory granularity. Furthermore, the embodiment of the disclosure proposes a mechanism for solving collision with the system address of the read/write instruction during the isolation of the failed memory granularity, effectively preventing the collision due to access to the BANK area where the failed memory granularity is located, or solving a problem as to errors in the returned data.

Figure 8:
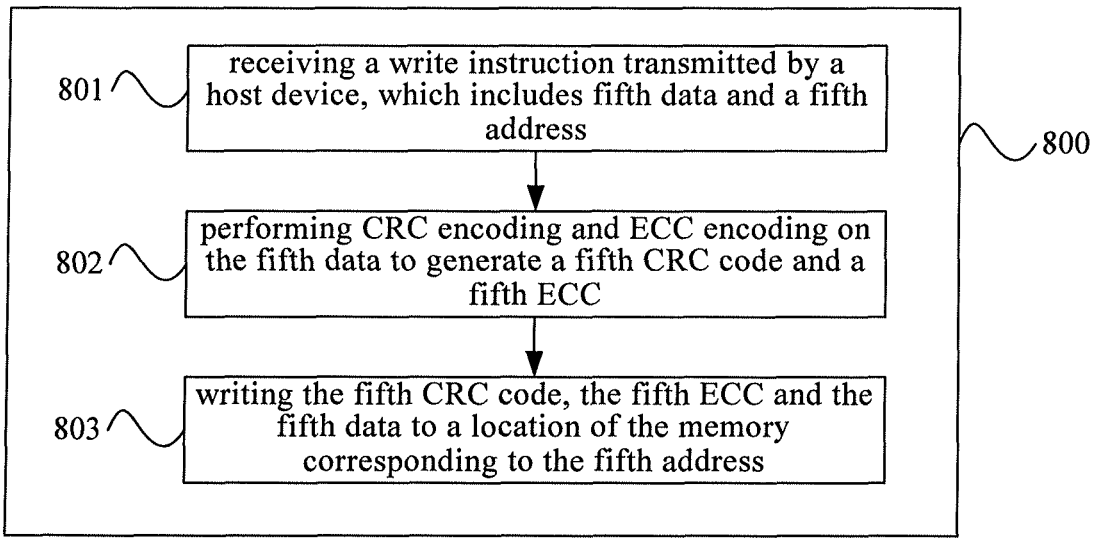
FIG. 8 is a flowchart showing the third example of the data processing method according to the embodiment of the disclosure.

FIG. 8 is a flowchart showing the third example of the data processing method according to the embodiment of the disclosure. As illustrated in FIG. 8, the example 800 comprises the steps as follows.

Step 801: receiving a write instruction transmitted by the host device, which includes fifth data and a fifth address.

For example, the DDR controller receives a write instruction transmitted by the CPU. The fifth address is the write instruction address and also referred to as the system address. The fifth data is the data to be written into the memory.

Step 802: performing CRC encoding and ECC encoding on the fifth data to generate a fifth CRC code and a fifth ECC.

Step 803: writing the fifth CRC code, the fifth ECC and the fifth data to a location of the memory corresponding to the fifth address.

Here, the fifth address can be transformed to a physical address of the memory using the prior art technique. Then, the data is written to the location of the memory corresponding to the physical address. The embodiment of the disclosure imposes no restriction in this regard.

Moreover, the fifth data typically includes plural sets of write data, each of which may correspond to 256 bits of data in the first to fourth banks of the DIMM as shown in FIG. 1. In step 802, each set of write data is individually CRC encoded and ECC encoded to generate the fifth CRC code and the fifth ECC for each set of write data. In step 803, each set of write data together with its fifth CRC code and fifth ECC can be sequentially written to the memory.

In an alternate embodiment of the disclosure, the memory Bank corresponding to the fifth address has been isolated. In this scenario, the following step can be intervened before the step 802: if the memory Bank corresponding to the fifth address has been isolated and the isolation has been completed, the fifth data is rearranged according to the current data arrangement after the isolation to generate rearranged sixth data.

Step 802 can comprise performing CRC encoding and ECC encoding on the sixth data to generate the fifth CRC code and the fifth ECC.

Step 803 can comprise writing the fifth CRC code, the fifth ECC and the sixth data to the location of the memory Bank corresponding to the fifth address according to the current data arrangement.

In particular, an isolation flag bit can be set for each memory Bank for flagging whether the Bank has been isolated and whether the isolation has been completed. Additionally, the current data arrangement after the isolation needs to be recorded when the isolation is completed. For example, the current data arrangement is shown in FIG. 6.

In another alternate embodiment of the disclosure, the memory Bank corresponding to the fifth address is under isolation. In this scenario, the method can comprise, before the step 802:

reading a second address and a third address if the memory Bank corresponding to the fifth address is under isolation, wherein the second address is the address from which data has been read in the isolation and the third address is the address to which data has been written in the isolation;

rearranging the fifth data according to the current data arrangement after the isolation to generate rearranged sixth data if the fifth address is not greater than the third address.

Step 802 can comprise performing CRC encoding and ECC encoding on the sixth data to generate a sixth CRC code and a sixth ECC.

Step 803 can comprise writing the sixth CRC code, the sixth ECC and the sixth data to the location of the memory corresponding to the fifth address according to the current data arrangement.

In yet another alternate embodiment of the disclosure, the memory Bank corresponding to the fifth address has not been isolated. In this scenario, the method can comprise, before the step 802: rearranging the fifth data according to the initial data arrangement to generate rearranged sixth data if the memory Bank corresponding to the fifth address has not been isolated.

Step 802 can comprise performing CRC encoding and ECC encoding on the sixth data to generate the fifth CRC code and the fifth ECC.

Step 803 can comprise writing the fifth CRC code, the fifth ECC and the sixth data to the location of the memory corresponding to the fifth address according to the initial data arrangement.

Here, the initial data arrangement refers to the default data arrangement of the memory Bank. For example, an initial data arrangement is shown in FIG. 4.

It is noted that the same initial data arrangement can be set for the host device and the memory in the practical application. That is to say, the fifth data included in the write instruction transmitted by the host device itself has the same data arrangement as the initial data arrangement of the memory Bank. Thus, if the memory Bank has never been isolated, the steps 802 and 803 can be directly performed without rearrangement of the fifth data.

In the embodiment of the disclosure, it is possible to overcome the problem as to insufficient capability of error detection of the ECC by performing CRC encoding and ECC encoding on the fifth data to be written to the memory and then writing the fifth data together with the CRC code and the ECC to the memory, thereby improving the system performance.

Figure 9:
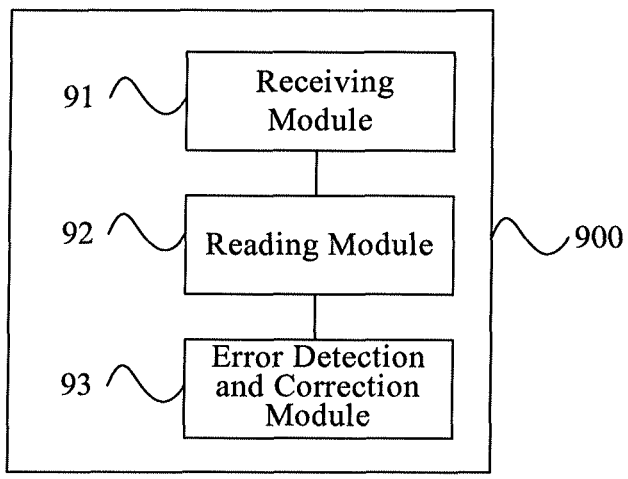
FIG. 9 is a structural diagram showing the first example of a data processing apparatus according to an embodiment of the disclosure.

FIG. 9 is a structural diagram showing the first example of a data processing apparatus according to an embodiment of the disclosure. As shown in FIG. 9, the example 900 comprises:

a receiving module 91 configured to receive a read instruction transmitted by a host device, the read instruction including a first address;

a reading module 92 configured to read first data as well as a first CRC code and a first ECC which are associated with the first data from a memory according to the first address; and an error detection and correction module 93 configured to perform error detection on the first data based on the first CRC code and perform error correction on the first data based on the first ECC if an error is detected.

This embodiment can be implemented in view of the first example of the data processing method according to the present disclosure. The disclosure can overcome the problem as to insufficient capability of error detection of the ECC in the prior art by performing error detection on the data read from the memory based on the CRC code with better capability of error detection and performing error correction on the read data based on the Error Correction Code, ECC, if an error is detected, thereby improving the system performance.

Figure 10:
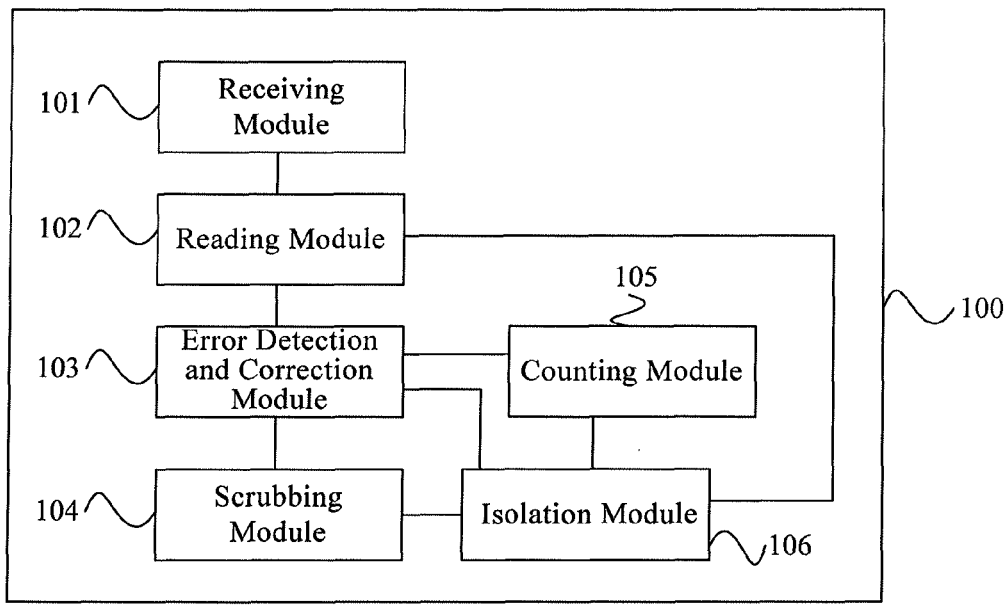
FIG. 10 is a structural diagram showing the second example of the data processing apparatus according to the embodiment of the disclosure.

FIG. 10 is a structural diagram showing the second example of the data processing apparatus according to the embodiment of the disclosure. As shown in FIG. 10, the example 100 comprises:

a receiving module 101 configured to receive a read instruction transmitted by a host device, the read instruction including a first address;

a reading module 102 configured to read first data as well as a first CRC code and a first ECC which are associated with the first data from a memory according to the first address; and an error detection and correction module 103 configured to perform error detection on the first data based on the first CRC code and perform error correction on the first data based on the first ECC to generate corrected second data if an error is detected;

a scrubbing module 104 configured to write the second data to the location of the memory where the first data is located.

Further, the error detection and correction module 103 is configured to determine an error in first sub-data corresponding to the first memory granularity in the first data.

The embodiment further comprises a counting module 105 configured to increment an error correction count associated with the first memory granularity by one if the error in the first sub-data is correctable.

The error detection and correction module 103 is configured to perform error correction on the first sub-data based on the first ECC to generate corrected second data if the error correction count associated with the first memory granularity does not exceed the preset threshold value.

It further comprises an isolation module 106 configured to perform isolation on the first memory granularity if the error correction count associated with the first memory granularity exceeds the preset threshold value.

Further, the isolation module 106 is configured to control the reading module 102 to read third data and third ECC associated with the third data stored in the memory Bank where the first memory granularity is located; control the error detection and correction module 103 to perform error correction on the third sub-data corresponding to the first memory granularity in the third data based on the third ECC, transfer the corrected third sub-data to a location corresponding to another memory granularity to generate corrected fourth data, and write the fourth data to the memory Bank.

Further, the isolation module 106 is configured to control the error detection and correction module 103 to transfer the corrected third sub-data to the location of the memory granularity corresponding to the third ECC.

Further, the isolation module 106 is configured to record the address from which data has been read as a second address while controlling the reading module 102 to read the third data and the third ECC associated with the third data stored in the memory Bank where the first memory granularity is located; and record the address to which data has been written as a third address when the fourth data is written into the memory Bank.

Further, the receiving module 101 is also configured to receive a write instruction including a fourth address, which falls within the address region of the memory Bank.

The isolation module 106 is configured to set the second address to a value less than the fourth address after writing is performed according to the write instruction, if the fourth address is not greater than the second address and greater than the third address.

This embodiment can be implemented in view of the second example of the data processing method according to the embodiment of the disclosure. In the embodiment of the disclosure, the CRC code with better capability of error detection is adopted to perform error detection on the data read from the memory. If any error is detected, error correction is performed on the read data using the Error Correction Code, ECC. The memory granularity corresponding to the erroneous data is identified during the error correction. The times for which the individual memory granularities encounter errors are counted. The memory granularity will be determined as failed and isolated if the counted times exceed a preset threshold value. Consequently, the disclosure can overcome the problem as to insufficient capability of error detection of ECC, thereby improving the system performance and preventing the impact on the system performance due to failed memory granularity. Furthermore, the embodiment of the disclosure proposes a mechanism for solving collision with the system address of the read/write instruction during the isolation of the failed memory granularity, effectively preventing the collision due to access to the BANK area where the failed memory granularity is located, or solving a problem as to errors in the returned data.

Figure 11:
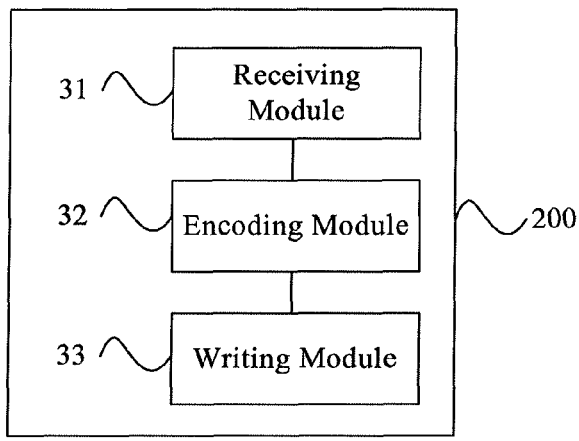
FIG. 11 is a structural diagram showing the third example of the data processing apparatus according to the embodiment of the disclosure.

FIG. 11 is a structural diagram showing the third example of the data processing apparatus according to the embodiment of the disclosure. As shown in FIG. 11, the example 200 comprises:

a receiving module 31 configured to receive a write instruction transmitted by a host device, the read instruction including fifth data and a fifth address;

an encoding module 32 configured to perform CRC encoding and ECC encoding on the fifth data to generate fifth CRC code and fifth ECC;

a writing module 33 configured to write the fifth CRC code, the fifth ECC and the fifth data to a location of the memory corresponding to the fifth address.

In an alternate embodiment of the disclosure, the apparatus further comprises:

a rearrangement module configured to rearrange the fifth data according to the current data arrangement after the isolation to generate rearranged sixth data if the memory Bank corresponding to the fifth address has been isolated and the isolation has been completed.

The encoding module 32 is configured to perform CRC encoding and ECC encoding on the sixth data to generate the fifth CRC code and the fifth ECC.

The writing module 33 is configured to write the fifth CRC code, the fifth ECC and the sixth data to the location of the memory corresponding to the fifth address according to the current data arrangement.

In another alternate embodiment of the disclosure, the apparatus further comprises:

a rearrangement module configured to read a second address and a third address if the memory Bank corresponding to the fifth address is under isolation, wherein the second address is the address from which data has been read in the isolation and the third address is the address to which data has been written in the isolation; and rearrange the fifth data according to the current data arrangement after the isolation to generate rearranged sixth data if the fifth address is not greater than the third address.

The encoding module 32 is configured to perform CRC encoding and ECC encoding on the sixth data to generate the fifth CRC code and the fifth ECC.

The writing module 33 is configured to write the fifth CRC code, the fifth ECC and the sixth data to the location of the memory corresponding to the fifth address according to the current data arrangement.

In yet another embodiment of the disclosure, the apparatus further comprises:

a rearrangement module configured to rearrange the fifth data according to the initial data arrangement to generate rearranged sixth data if the memory Bank corresponding to the fifth address has never been isolated.

The encoding module 32 is configured to perform CRC encoding and ECC encoding on the sixth data to generate the fifth CRC code and the fifth ECC.

The writing module 33 is configured to write the fifth CRC code, the fifth ECC and the sixth data to the location of the memory corresponding to the fifth address according to the initial data arrangement.

This embodiment can be implemented in view of the third example of the data processing method according to the embodiment of the disclosure. With the embodiment of the disclosure, it is possible to overcome the problem as to insufficient capability of error detection of the ECC by performing CRC encoding and ECC encoding on the fifth data to be written to the memory and then writing the fifth data together with the CRC code and the ECC to the memory, thereby improving the system performance.

Figure 12:
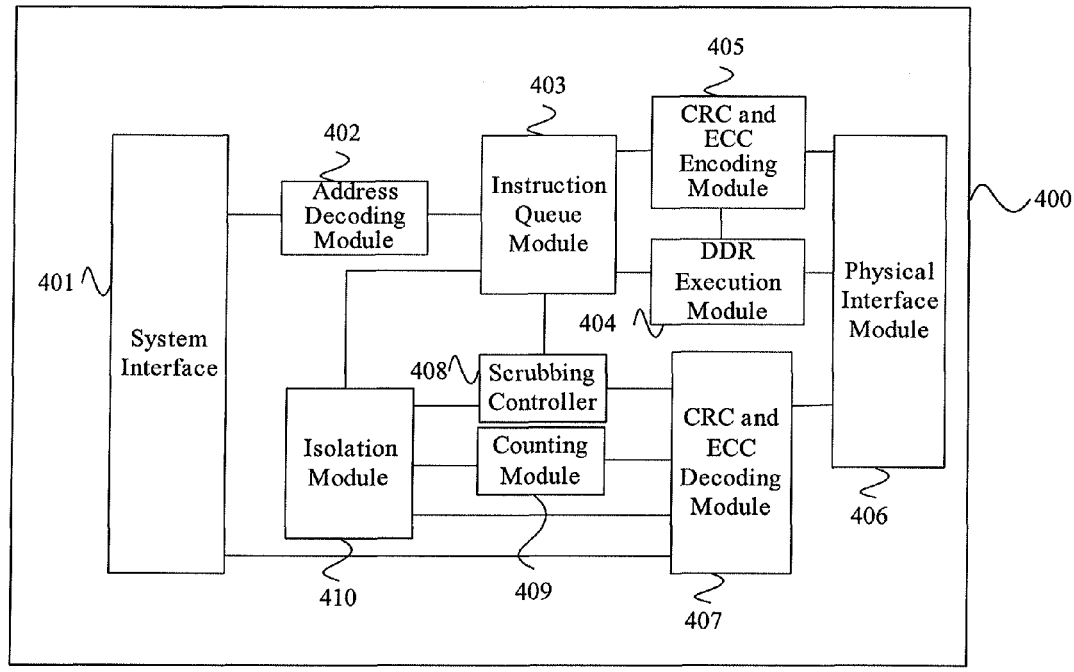
FIG. 12 is a structural diagram showing the fourth example of the data processing apparatus according to the embodiment of the disclosure.

FIG. 12 is a structural diagram showing the fourth example of the data processing apparatus according to the embodiment of the disclosure. As shown in FIG. 12, the exemplary apparatus 400 comprises:

a system interface 401 configured to receive a read/write instruction transmitted by a host device, the read/write instruction including a system address;

an address decoding module 402 configured to decode the system address into a physical address of a memory;

an instruction queue module 403 configured to schedule an instruction queue according to a type, a priority or the like of an instruction;

a DDR execution module 404 configured to process the instruction in the instruction queue according to a DDR protocol to generate a resultant controlling instruction in compliance with DDR timing, and control timing and sequence at/in which encoded data generated by a CRC and ECC encoding module 405 enters a physical interface module 406;

the CRC and ECC encoding module 405 configured to perform CRC and ECC encoding on write data in the write instruction;

the physical interface module 406 configured to transmit the resultant controlling instruction generated by the DDR execution module 404 and/or the write data encoded by the CRC and ECC encoding module 405 together with the CRC code and the ECC associated with the write data to the DDR PHY; and receive the read data read from the memory together with the CRC code and ECC associated with said read data, which is transmitted by the DDR PHY;

a CRC and ECC decoding module 407 configured to perform error detection and correction on the read data based on the CRC code and ECC associated with the read data;

a counting module 409 configured to increment an error correction count associated with the first memory granularity by one if the CRC and ECC decoding module 407 detects a sub-data error associated with the first memory granularity in the read data and the error is correctable;

an isolation module 410 configured to control a scrubbing controller 408 to write the read data corrected by the CRC and ECC decoding module 407 back to the memory if the error correction count associated with the first memory granularity does not exceed the preset threshold value; and perform isolation on the first memory granularity if the count exceeds the preset threshold value; and the scrubbing controller 408 configured to write the read data corrected by the CRC and ECC decoding module 407 back to the memory according to the instruction from the isolation module 410.

In particular, the isolation module 410 transmits a read instruction to the instruction queue module 403 to read all the data in the memory Bank where the first memory granularity is located, referred to as the third data. The CRC and ECC decoding module 407 performs error correction on the third data based on the ECC associated with the third data that is read out together with the third data, for example, on the third sub-data corresponding to the first memory granularity in the third data. The isolation module 410 assembles the corrected third data into the write instruction to be transmitted to the instruction queue module 403, and instructs the CRC and ECC encoding module 405 to rearrange the corrected third data such that no data is disposed at the location corresponding to the first memory granularity. The CRC and ECC encoding module 405 performs the CRC and ECC encoding after rearrangement of data. The subsequent process proceeds similarly with the conventional writing operation and the description thereof is omitted here.

This embodiment can be implemented in view of the second example of the data processing method according to the embodiment of the disclosure. In the embodiment of the disclosure, the CRC code with better capability of error detection is adopted to perform error detection on the data read from the memory. If any error is detected, error correction is performed on the read data using the Error Correction Code, ECC. The memory granularity corresponding to the erroneous data is identified during the error correction. The times for which the individual memory granularities encounter errors are counted. The memory granularity will be determined as failed and isolated if the counted times exceed a preset threshold value. Consequently, the disclosure can overcome the problem as to insufficient capability of error detection of ECC, thereby improving the system performance and preventing the impact on the system performance due to failed memory granularity.

Figure 13:
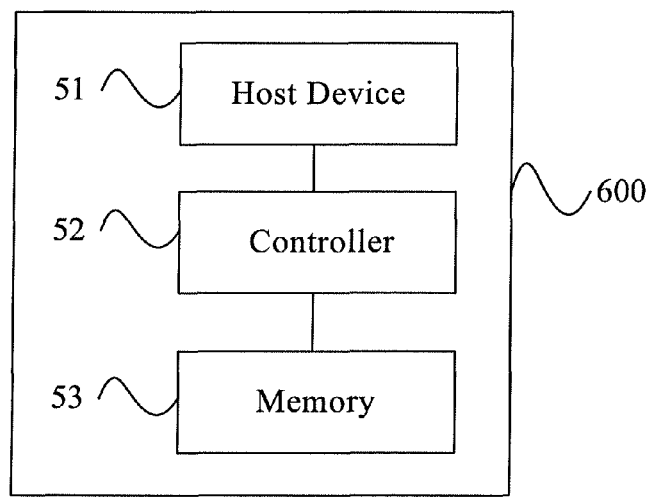
FIG. 13 is a structural diagram showing a data processing system according to an embodiment of the disclosure.

FIG. 13 is a structural diagram showing an example of a data processing system according to an embodiment of the disclosure. As shown in FIG. 13, the exemplary system 600 comprises a host device 51, a controller 52 and a memory 53, which are connected in sequence.

The host device 51 is configured to transmit a read instruction to the controller 52.

The controller 52 comprises an apparatus described as the first or second example of the data processing apparatus according to the embodiment of the disclosure.

The memory 53 is configured to store the first data, the first Cyclic Redundancy Checks, CRC, code and the first Error Correction Code, ECC, which are associated with the first data.

In an alternate embodiment of the disclosure, the controller 52 further comprises a data processing apparatus described as the third example of the data processing apparatus according to the embodiment of the disclosure.

The host device 51 is further configured to transmit a write instruction to the controller 52.

In application, the memory 53 comprises at least one memory Bank. Each memory Bank comprises a plurality of memory granularities. At least one of the memory granularities is used to store data while at least two of the remaining memory granularities are used to store the CRC code and the ECC associated with the data.

In another alternate embodiment of the disclosure, it further comprises a DDR physical layer via which the controller 52 is coupled to the memory 53.

In yet another alternate embodiment of the disclosure, the controller 52 comprises an apparatus described as the fourth example of the data processing apparatus according to the embodiment of the disclosure, and the host device 51 is configured to transmit a read/write instruction to the controller 52.

With the embodiment of the disclosure, the CRC code with better capability of error detection is adopted to perform error detection on the data read from the memory. If any error is detected, error correction is performed on the read data using the Error Correction Code, ECC. Thus, it can overcome the problem as to insufficient capability of error detection of ECC, thereby improving the system performance.

A skilled person in the art would appreciate that all or part of the methodological steps as described with reference to the embodiment(s) of the application can be implemented with programs instructing the related hardware such as a hardware processor. The programs can be stored in a computer readable medium and instruct the processor to perform, while being executed, the steps comprising the method(s) according to the embodiment(s) of the disclosure. The computer readable medium may include, but not limited to, Random Access Memory (RAM), memory, Read Only Memory (ROM), magnetic disk, optical disc or any other storage media for storage of program codes.

Although some of the embodiments of the application are illustrated and described here, it would be appreciated that any modification to the embodiments should fall within the scope of the application without departing from the principle and spirit of the application.

What is claimed is:

1. A data processing method, comprising:
receiving a read instruction transmitted by a host device, the read instruction including a first address;
reading first data together with a first Cyclic Redundancy Checks (CRC) code and a first Error Correction Code (ECC), which are associated with the first data from a memory based on the first address; and
performing error detection on the first data based on the first CRC code, and performing error correction on the first data based on the first ECC if an error is detected based on the first CRC code,
wherein performing error correction on the first data based on the first ECC comprises:
determining that the error occurs in first sub-data of the first data corresponding to a first memory granularity of the memory and incrementing an error correction count associated with the first memory granularity by one; and
performing error correction on the first sub-data based on the first ECC if the error correction count associated with the first memory granularity does not exceed a preset threshold value.

2. The method according to claim 1, wherein performing error correction on the first data based on the first ECC if an error is detected comprises:
performing error correction on the first data based on the first ECC to generate corrected second data and writing the second data to a location of the memory where the first data is located.

3. The method according to claim 1, further comprising:
performing isolation on the first memory granularity if the error correction count associated with the first memory granularity exceeds the preset threshold value.

4. The method according to claim 3, wherein performing isolation on the first memory granularity comprises:
reading third data and third ECC associated with the third data, wherein the third data is all data stored in a memory Bank where the first memory granularity is located; and
performing error correction on third sub-data of the third data corresponding to the first memory granularity in the third data based on the third ECC, transferring the corrected third sub-data to a location corresponding to another memory granularity to generate corrected fourth data, and writing the fourth data to the memory Bank.

5. The method according to claim 4, wherein transferring the corrected third sub-data to a location corresponding to a different memory granularity comprises:
transferring the corrected third sub-data to a memory granularity corresponding to the first ECC.

6. The method according to claim 4,
wherein reading third data and third ECC associated with the third data stored in a memory Bank where the first memory granularity is located comprises:
recording an address from which data has been read as a second address, and
wherein writing the fourth data to the memory Bank comprises:
recording an address to which data has been written as a third address.

7. The method according to claim 6, further comprising:
receiving a write instruction comprising a fourth address, which falls within an address region of the memory Bank; and
setting the second address to a value less than the fourth address after writing is performed according to the write instruction, if the fourth address is not greater than the second address and greater than the third address.

8. A data processing method, comprising:
receiving a write instruction transmitted by a host device, the write instruction comprising fifth data and a fifth address;
performing Cyclic Redundancy Checks (CRC) encoding and Error Correction Code (ECC) encoding on the fifth data to generate a fifth CRC code and a fifth ECC;
writing the fifth CRC code, the fifth ECC and the fifth data to a location of a memory corresponding to the fifth address, and
before performing CRC encoding and ECC encoding on the fifth data:
if a memory Bank corresponding to the fifth address has been isolated and the isolation has been completed, rearranging the fifth data according to a current data arrangement after the isolation to generate rearranged sixth data,
wherein performing CRC encoding and ECC encoding on the fifth data to generate a fifth CRC code and a fifth ECC comprises:
performing the CRC encoding and the ECC encoding on the sixth data to generate the fifth CRC code and the fifth ECC, and
wherein writing the fifth CRC code, the fifth ECC and the fifth data to a location of a memory corresponding to the fifth address comprises:
writing the fifth CRC code, the fifth ECC and the sixth data to the location of the memory Bank corresponding to the fifth address according to the current data arrangement.

9. The method according to claim 8, further comprising, before performing CRC encoding and ECC encoding on the fifth data:
reading a second address and a third address if a memory Bank corresponding to the fifth address is under isolation, wherein the second address is an address from which data has been read in the isolation and the third address is an address to which data has been written in the isolation; and
rearranging the fifth data according to a current data arrangement after the isolation to generate rearranged sixth data if the fifth address is not greater than the third address,
wherein performing CRC encoding and ECC encoding on the fifth data to generate a fifth CRC code and a fifth ECC comprises:
performing the CRC encoding and the ECC encoding on the sixth data to generate a sixth CRC code and a sixth ECC, and
wherein writing the fifth CRC code, the fifth ECC and the fifth data to a location of a memory corresponding to the fifth address comprises:
writing the sixth CRC code, the sixth ECC and the sixth data to the location of the memory Bank corresponding to the fifth address according to the current data arrangement.

10. The method according to claim 8, further comprising, before performing CRC encoding and ECC encoding on the fifth data:
rearranging the fifth data according to an initial data arrangement to generate rearranged sixth data if the memory Bank corresponding to the fifth address has not been isolated,
wherein performing CRC encoding and ECC, encoding on the fifth data to generate a fifth CRC code and a fifth ECC comprises:
performing the CRC encoding and the ECC encoding on the sixth data to generate the fifth CRC code and the fifth ECC, and wherein writing the fifth CRC code, the fifth ECC and the fifth data to a location of a memory corresponding to the fifth address comprises:
writing the fifth CRC code, the fifth ECC and the sixth data to the location of the memory Bank corresponding to the fifth address according to the initial data arrangement.

11. A data processing apparatus, comprising:
a receiving module configured to receive a read instruction transmitted by a host device, the read instruction comprising a first address;
a reading module configured to read first data as well as a first Cyclic Redundancy Checks (CRC) code and a first Error Correction Code (ECC) which are associated with the first data from a memory according to the first address;
an error detection and correction module configured to perform error detection on the first data based on the first CRC code and perform error correction on the first data based on the first ECC if an error is detected,
wherein the error detection and correction module is further configured to determine that the error occurs in first sub-data of the first data corresponding to a first memory granularity of the memory; and
a counting module configured to increment an error correction count associated with the first memory granularity by one,
wherein the error detection and correction module is further configured to perform error correction on the first sub-data based on the first ECC if the error correction count associated with the first memory granularity does not exceed a preset threshold value.

12. The data processing apparatus according to claim 11, wherein the error detection and correction module is further configured to perform error correction on the first data based on the first ECC to generate corrected second data,
the data processing apparatus further comprising:
a scrubbing module configured to write the second data to a location of the memory where the first data is located.

13. The data processing apparatus according to claim 11, further comprising:
an isolation module configured to perform isolation on the first memory granularity if the error correction count associated with the first memory granularity exceeds the preset threshold value.

14. The data processing apparatus according to claim 13, wherein the isolation module is further configured to:
control the reading module to read third data and third ECC associated with the third data, wherein the third data is all data stored in a memory Bank where the first memory granularity is located; control the error detection and correction module to perform error correction on third sub-data of the third data corresponding to the first memory granularity based on the third ECC, transfer the corrected third sub-data to a location corresponding to another memory granularity to generate corrected fourth data, and write the fourth data to the memory Bank.

15. The data processing apparatus according to claim 14, wherein the isolation module is further configured to:
control the error detection and correction module to transfer the corrected third sub-data to the location of the memory granularity corresponding to the third ECC.

16. The data processing apparatus according to claim 14, wherein the isolation module is further configured to:
record an address from which data has been read as a second address while controlling the reading module to read the third data and the third ECC associated with the third data stored in the memory Bank where the first memory granularity is located; and
record an address to which data has been written as a third address when the fourth data is written into the memory Bank.

17. The data processing apparatus according to claim 16, wherein the receiving module is further configured to receive a write instruction comprising a fourth address, which falls within an address region of the memory Bank, and
wherein the isolation module is further configured to set the second address to a value less than the fourth address after writing is performed according to the write instruction, if the fourth address is not greater than the second address and greater than the third address.

18. A data processing apparatus, comprising:
a receiving module configured to receive a write instruction transmitted by a host device, the read instruction comprising fifth data and a fifth address;
an encoding module configured to perform Cyclic Redundancy Checks (CRC) encoding and Error Correction Code (ECC) encoding on the fifth data to generate fifth CRC code and fifth ECC;
a writing module configured to write the fifth CRC code, the fifth ECC and the fifth data to a location of a memory corresponding to the fifth address; and
a rearrangement module configured to rearrange the fifth data according to a current data arrangement after isolation to generate rearranged sixth data if a memory Bank corresponding to the fifth address has been isolated and the isolation has been completed,
wherein the encoding module is further configured to perform the CRC encoding and the ECC encoding on the sixth data to generate the fifth CRC code and the fifth ECC, and
wherein the writing module is further configured to write the fifth CRC code, the fifth ECC and the sixth data to a location of the memory Bank corresponding to the fifth address according to the current data arrangement.

19. The data processing apparatus according to claim 18, further comprising:
a rearrangement module configured to read a second address and a third address if a memory Bank corresponding to the fifth address is under isolation,
wherein the second address is an address from which data has been read in the isolation and the third address is an address to which data has been written in the isolation; and rearrange the fifth data according to the current data arrangement after the isolation to generate rearranged sixth data if the fifth address is not greater than the third address;
wherein the encoding module is further configured to perform the CRC encoding and the ECC encoding on the sixth data to generate the fifth CRC code and the fifth ECC, and
wherein the writing module is further configured to write the fifth CRC code, the fifth ECC and the sixth data to a location of the memory Bank corresponding to the fifth address according to the current data arrangement.

20. The data processing apparatus according to claim 18, further comprising:
a rearrangement module configured to rearrange the fifth data according to an initial data arrangement to generate rearranged sixth data if a memory Bank corresponding to the fifth address has not been isolated, wherein the encoding module is further configured to perform the CRC encoding and the ECC encoding on the sixth data to generate the fifth CRC code and the fifth ECC, and wherein the writing module is further configured to write the fifth CRC code, the fifth ECC and the sixth data to a location of the memory Bank corresponding to the fifth address according to the current data arrangement.

\* \* \* \* \*